United States Patent
Wada et al.

(10) Patent No.: US 11,049,721 B2
(45) Date of Patent: Jun. 29, 2021

(54) METHOD AND PROCESS FOR FORMING MEMORY HOLE PATTERNS

(71) Applicant: Tokyo Electron Limited, Tokyo (JP)

(72) Inventors: Toshiharu Wada, Miyagi (JP); Akiteru Ko, Albany, NY (US); Anton deVilliers, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/561,350

(22) Filed: Sep. 5, 2019

(65) Prior Publication Data

US 2021/0035981 A1 Feb. 4, 2021

Related U.S. Application Data

(60) Provisional application No. 62/881,161, filed on Jul. 31, 2019.

(51) Int. Cl.
*H01L 21/033* (2006.01)
*H01L 21/308* (2006.01)
*H01L 21/311* (2006.01)
*H01L 27/108* (2006.01)

(52) U.S. Cl.
CPC ...... *H01L 21/0335* (2013.01); *H01L 21/0337* (2013.01); *H01L 21/3086* (2013.01); *H01L 21/31144* (2013.01); *H01L 27/10844* (2013.01); *H01L 27/10852* (2013.01)

(58) Field of Classification Search
CPC ......... H01L 27/10844; H01L 21/32139; H01L 21/31144; H01L 21/0337; H01L 21/3086
See application file for complete search history.

(56) References Cited

U.S. PATENT DOCUMENTS

| | | | |
|---|---|---|---|
| 9,240,329 B2 | 1/2016 | deVilliers | |
| 9,564,446 B1* | 2/2017 | Weybright | H01L 27/1104 |
| 2009/0142932 A1* | 6/2009 | Jung | H01L 21/3086 |
| | | | 438/736 |
| 2012/0282751 A1* | 11/2012 | Oh | H01L 21/0338 |
| | | | 438/382 |
| 2012/0282778 A1* | 11/2012 | Light | H01L 21/0338 |
| | | | 438/703 |

(Continued)

*Primary Examiner* — Errol V Fernandes
*Assistant Examiner* — Jeremy J Joy
(74) *Attorney, Agent, or Firm* — Slater Matsil, LLP

(57) ABSTRACT

A self-aligned multiple patterning (SAMP) process is disclosed for formation of structures on substrates. The process provides improved local critical dimension uniformity by using a first (lower) multicolor array pattern and second (upper) multicolor array pattern. The dimensions of finally formed structures are defined by the overlap of a first spacer that is formed as part of the first multicolor array pattern and a second spacer that is formed as part of the second multicolor array pattern. The spacer widths which control the critical dimension of the formed structure may be highly uniform due to the nature of spacer formation and the use of an atomic layer deposition process for forming the spacer layers of the both first (lower) multicolor array pattern and second (upper) multicolor array pattern. In one embodiment, the structure formed by a memory hole pattern for a dynamic random access memory (DRAM).

20 Claims, 17 Drawing Sheets

(56) References Cited

U.S. PATENT DOCUMENTS

| | | | |
|---|---|---|---|
| 2012/0289019 A1* | 11/2012 | Im | H01L 45/1675 |
| | | | 438/381 |
| 2013/0260562 A1* | 10/2013 | Park | H01L 21/308 |
| | | | 438/702 |
| 2015/0064906 A1* | 3/2015 | Sei | H01L 21/0337 |
| | | | 438/694 |
| 2015/0243518 A1* | 8/2015 | deVilliers | H01L 21/3212 |
| | | | 438/692 |
| 2018/0174894 A1* | 6/2018 | Bouche | H01L 21/31144 |
| 2019/0326163 A1* | 10/2019 | Xu | H01L 21/845 |

\* cited by examiner

METHOD AND PROCESS FOR FORMING MEMORY HOLE PATTERNS

This application claims priority to U.S. Provisional Patent Application No. 62/881,161, entitled "Method and Process for Forming Memory Hole Patterns" filed Jul. 31, 2019; the disclosure of which is expressly incorporated herein, in its entirety, by reference.

BACKGROUND

The present disclosure relates to the processing of substrates. In particular, it provides a novel method for forming patterns during the processing of substrates.

As geometries in substrate processing continue to shrink, the technical challenges to forming structures on substrates via photolithography techniques increase. As requirements for smaller geometry structures arose, a variety of photolithography techniques have been utilized for achieving suitable photolithography for such structures, including extreme ultraviolet (EUV) lithography, multiple patterning schemes (including self-aligned multiple patterning (SAMP) schemes such as, for example, self-aligned double patterning (SADP), self-aligned quadruple patterning (SAQP), self-aligned octuple patterning (SAOP), etc.), argon fluoride (ArF) lithography, or other small geometry patterning methods.

The formation of a memory hole for a dynamic random access memory (DRAM) is one process step in which a critical dimension (CD) and local CD uniformity (LCDU) is of particular importance due to the small memory hole diameters and the close packing of memory holes. One conventional process for such applications is a SAMP process. The conventional SAMP process may superimpose two multicolor pattern arrays to form the memory hole by selectively cutting overlapping portions of materials. However, it is difficult to locally control CDs due to variations in the process from pitch walking and other effects, including etch effects. Specifically, the cut CD will have variation due to both mandrel and gap fill CD variation. An example of the conventional process flow is shown with regard to FIGS. 1A-4B with regard to perspective views (FIGS. 1A, 2A, 3A and 4A) and associated top views (FIGS. 1B, 2B, 3B and 4B) of the process steps. First, as shown in FIG. 1A, a substrate 100 with multiple layers formed on it is provided, such as a silicon nitride (SiN) layer 115 and an amorphous silicon (A-Si) layer 120. Underlying layers 110 are also provided. The underlying layers 110 may be comprised of a variety of patterned and/or unpatterned layers utilized in the processing of substrates as is well known in the art. Then, a first multicolor pattern array is formed above the A-Si layer 120 as shown in FIGS. 1A and 1B. As shown, A regions 125A, B regions 130A and C regions 135A may be patterned. Typically materials used for these regions may include oxides, nitrides, spin on carbon (SOC), etc., as is well known in the art.

Then a second multicolor array pattern may be provided as shown in FIGS. 2A, 2B, 3A and 3C. FIGS. 2A and 2B show the second multicolor array pattern conceptually in isolation as A regions 125B, B regions 130B, and C regions 135B. FIG. 3A illustrates the second multicolor array pattern in place on the substrate. FIG. 3B illustrates the impact of the overlap of the first multicolor array pattern and the second multicolor array pattern indicating the regions of overlay 300 (dashed line regions) which a multilayer etch process will remove. FIGS. 4A and 4B indicate the resulting pattern that will form in A-Si layer 120 (a pattern that corresponds to the pattern of the regions of overlay 300) after etching and subsequent removal of the first and second multicolor array patterns. As can be seen, when the pattern from the SAMP process is transferred to the A-Si layer 120, the pattern transfer provides a poor LCDU as shown in FIGS. 4A and 4B.

It would be desirable to provide an improved technique for forming patterns on a substrate.

SUMMARY

A self-aligned multiple patterning (SAMP) process is disclosed for formation of structures on substrates. The process provides improved local critical dimension uniformity by using a first (lower) multicolor array pattern and second (upper) multicolor array pattern. The dimensions of finally formed structures are defined by the overlap of a first spacer that is formed as part of the first multicolor array pattern and a second spacer that is formed as part of the second multicolor array pattern. The spacer widths which control the critical dimension of the formed structure may be highly uniform due to the nature of spacer formation and the use of an atomic layer deposition process for forming the spacer layers of the both first (lower) multicolor array pattern and second (upper) multicolor array pattern.

In one embodiment, a method of forming a structure on a substrate using a self-aligned multiple patterning (SAMP) process is provided. The method comprises providing one or more underlying layers within which a pattern of the structure is to be formed, providing a plurality of lower mandrels, and providing a lower spacer layer over the plurality of lower mandrels. The method further comprises forming a plurality of lower spacer structures from the lower spacer layer, the plurality of lower spacer structures forming a first set of features of a lower pattern array of the SAMP process. The method also comprises providing a plurality of upper mandrels above the lower pattern array of the SAMP process and providing an upper spacer layer over the plurality of upper mandrels. The method further comprises forming a plurality of upper spacer structures from the upper spacer layer, the plurality of upper spacer structures forming a first set of features in an upper pattern array of the SAMP process. The method further comprises performing a first selective pull etch to remove the plurality of upper spacers structures while utilizing at least the plurality of upper mandrels as an first mask pattern blocking the first selective pull etch. The method also comprises performing a second selective pull etch to remove at least a portion of the plurality of lower spacer structures while utilizing at least the plurality of upper mandrels and the plurality of lower mandrels as a second mask pattern blocking the second selective pull etch. Finally, the method comprises etching at least one of the one or more underlying layers in a pattern which corresponds to an overlap of the removed plurality of upper spacer structure and the removed portion of the plurality of lower spacer structures.

In one alternative of the method described above, the structure is a memory hole pattern. In another embodiment the critical dimensions of the memory hole pattern are set by a width of the upper spacer structures and a width of the lower spacer structures. In still another embodiment, the lower spacer layer is a lower atomic layer deposition layer and the upper spacer layer is an upper atomic layer deposition layer. In some embodiments, the lower spacer layer is a lower oxide layer and the upper spacer layer is an upper oxide layer. In some embodiments of the method, the lower pattern array of the SAMP process further comprises a lower gap-fill layer and the upper pattern array of the SAMP process further comprises an upper gap-fill layer. In yet another embodiment, the method further comprises performing a lower spacer etch of the lower spacer layer after providing the lower spacer layer over the plurality of lower mandrels.

In a second method embodiment disclosed herein, a method of forming a memory hole pattern on a substrate using a self-aligned multiple patterning (SAMP) process is described. The method may comprise providing a lower SAMP array pattern and providing a plurality of lower spacer features as part of the lower SAMP array pattern, the lower spacer features having at least a first dimension defined by a lower spacer width. The method further comprises providing an upper SAMP array pattern, the upper SAMP array pattern overlying the lower SAMP array pattern. The method still further comprises providing a plurality of upper spacer features as part of the upper SAMP array pattern, the upper spacer features having at least a second dimension defined by an upper spacer width, the first dimension being oriented differently from the second dimension. Finally, the method comprises etching the memory hole pattern in an underlying layer, the etching using an overlay of the plurality of lower spacer features and the upper spacer features to form the memory hole pattern so that a size of the memory hole pattern is defined by the lower spacer width and the upper spacer width.

In the second method embodiment described above, the lower spacer feature may be formed from a lower atomic layer deposition layer and the upper spacer feature may be formed from an upper atomic layer deposition layer. In yet another embodiment, the lower atomic layer deposition layer comprises oxide and the upper atomic layer deposition layer comprises oxide. In still another embodiment, the lower atomic layer deposition layer comprises silicon oxide and the upper atomic layer deposition layer comprises silicon oxide. In still another embodiment, the lower SAMP array pattern further comprises a lower mandrel layer and a lower gap-fill layer and the upper SAMP array pattern further comprises an upper mandrel layer and an upper gap-fill layer. In still another embodiment, the local critical dimension uniformity of the size of the memory hole pattern etched in the underlying layer is less than 1 nm.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

A self-aligned multiple patterning (SAMP) process is disclosed for formation of structures on substrates. The process provides improved local critical dimension uniformity by using a first (lower) multicolor array pattern and second (upper) multicolor array pattern. The dimensions of finally formed structures are defined by the overlap of a first spacer that is formed as part of the first multicolor array pattern and a second spacer that is formed as part of the second multicolor array pattern. The spacer widths which control the critical dimension of the formed structure may be highly uniform due to the nature of spacer formation and the use of an atomic layer deposition process for forming the spacer layers of the both first (lower) multicolor array pattern and second (upper) multicolor array pattern.

The patterned structures formed on a substrate according to the techniques described herein, may be, in one example, a hole pattern created with a SAMP process. In an exemplary patterned structure described herein, a hole pattern having good LCDU characteristics may be provided. In one embodiment, the hole pattern may be a memory hole pattern formed for use in the formation of a memory storage cell structure. In a more particular embodiment, the memory hole pattern may be the utilized as a dynamic random access (DRAM) hole pattern which will correspond to the pattern where dielectric material may be formed for use as a capacitive storage element of the DRAM.

As shown in FIGS. 5A-8B, a general conceptually process flow of the new SAMP technique is shown. In general, the variation in the hole pattern LCDU is suppressed by partially cutting Material B by using SAMP technology. Moreover, material B is formed using an atomic layer deposition (ALD) spacer process. The variation in film formation is very small in an ALD spacer, and the dimensions of the CD cut can also be determined by the film thickness of the ALD spacer. Further, since the spacer is not affected by Material A and Material C pitch walking, it is possible to construct a very stable process for the LCDU. In this manner ALD spacers are utilized to provide improved CD controllability, utilizing the advantages of ALD thicknesses (and corresponding spacer widths) being very controllable.

Figure 1A:
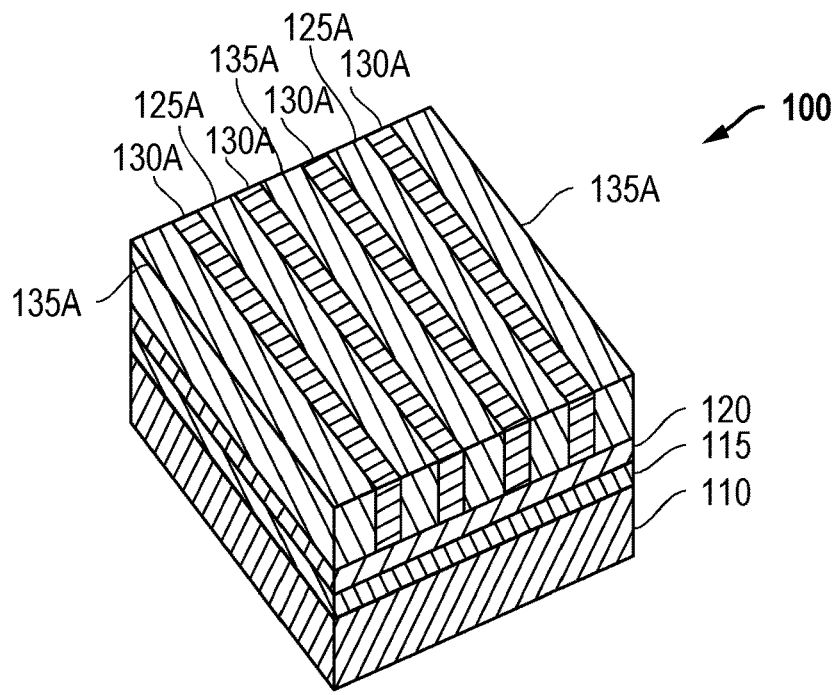
FIGS. 1A-4B illustrate a prior art SAMP process.
Figure 1B:
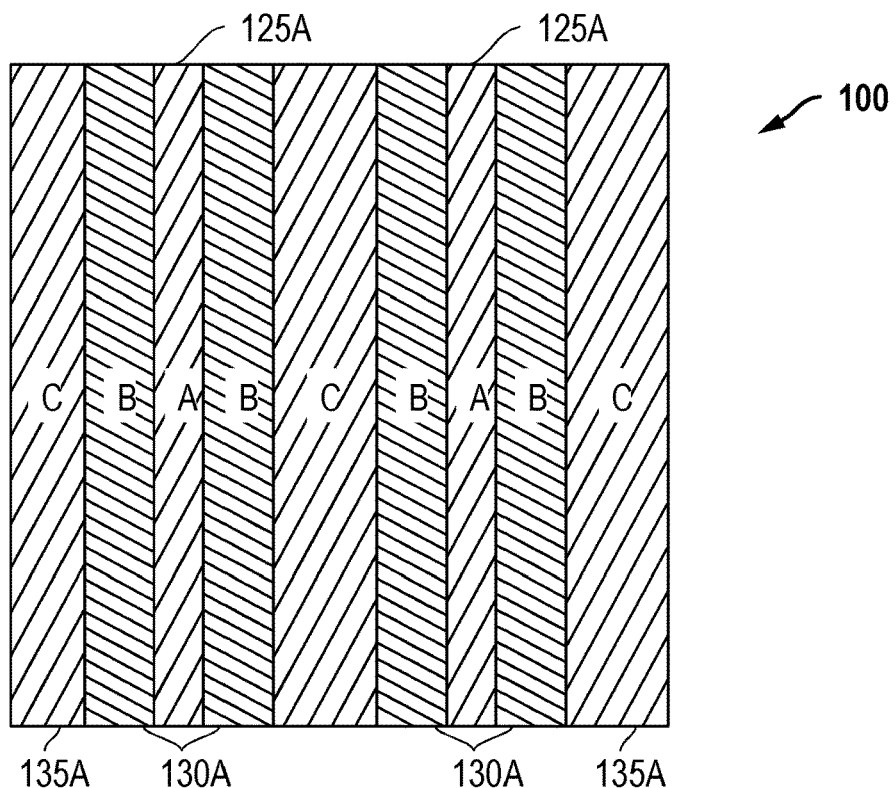
Figure 2A:
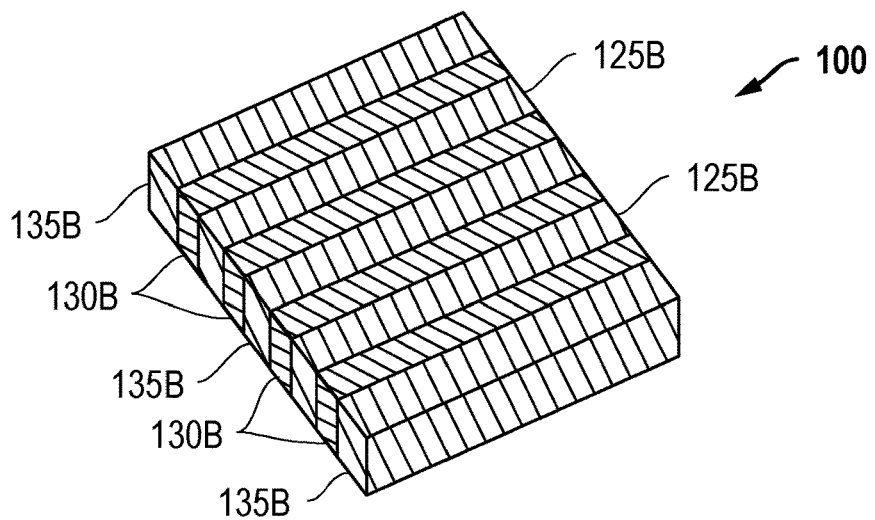
Figure 2B:
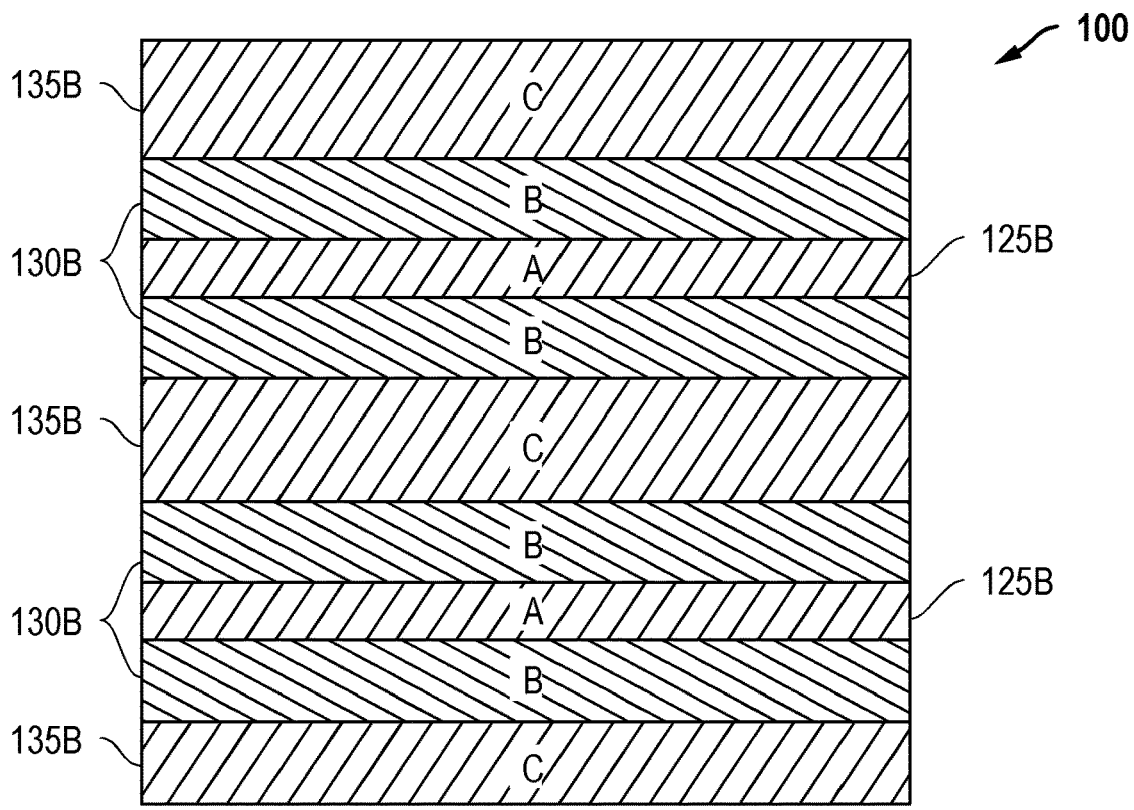
Figure 3A:
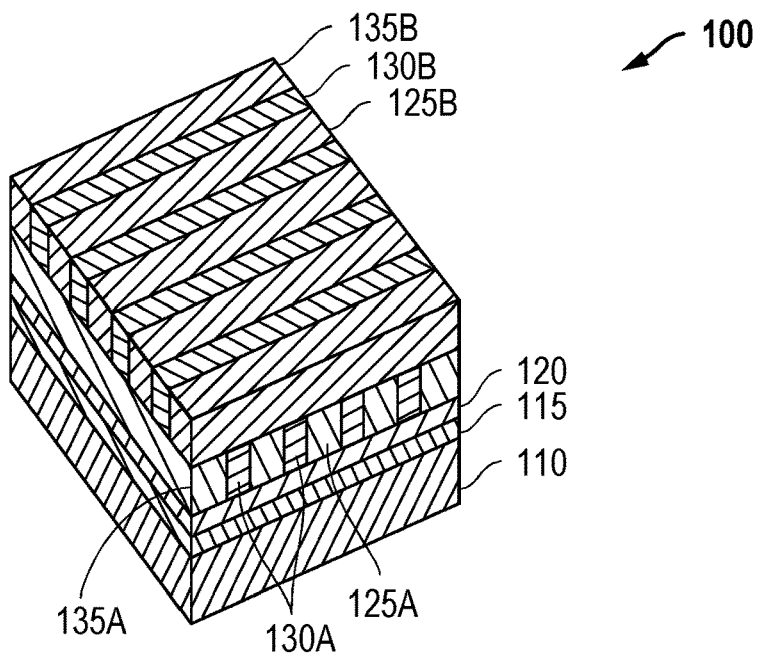
Figure 3B:
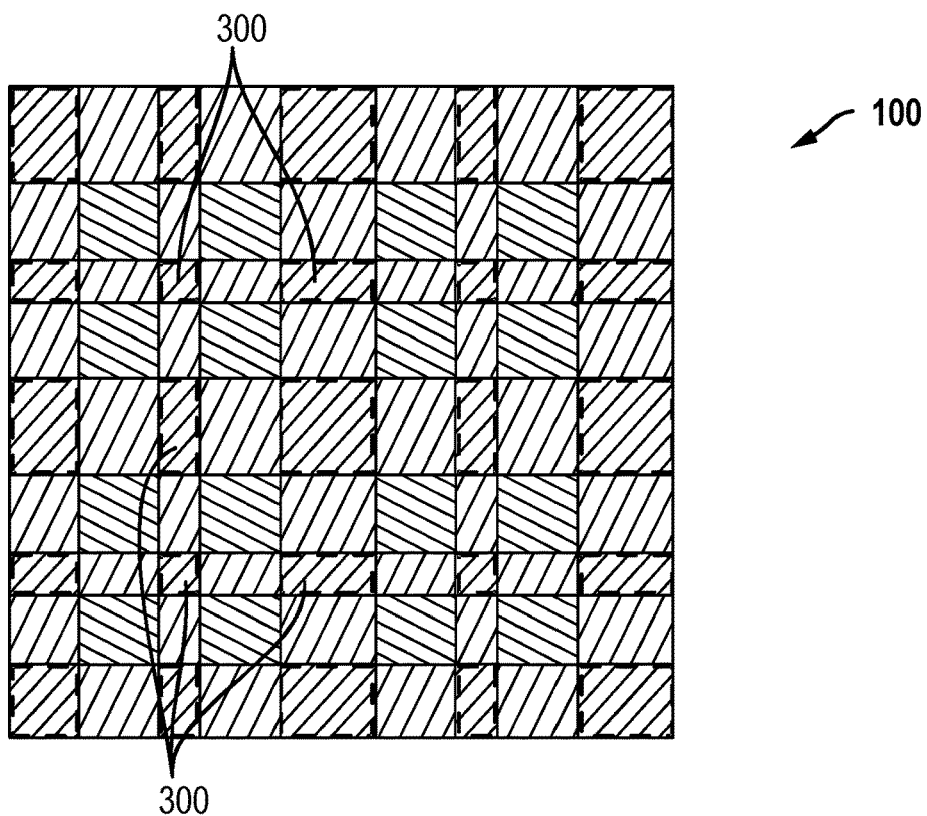
Figure 4A:
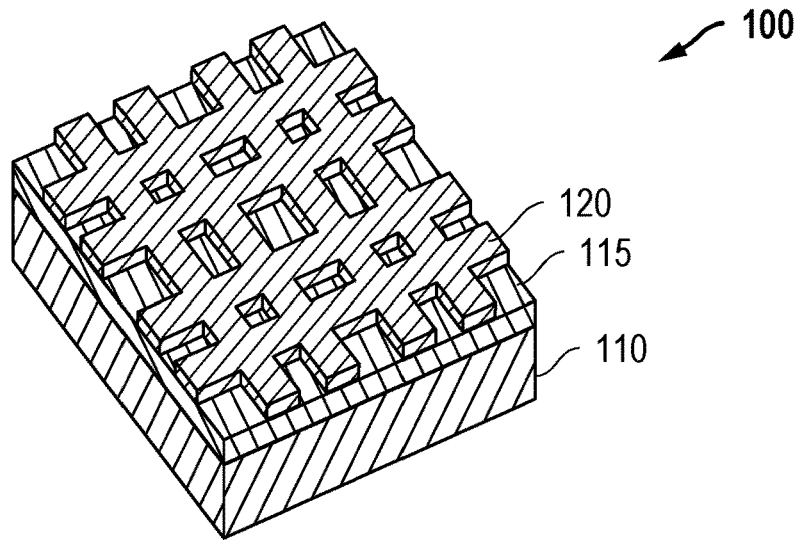
Figure 4B:
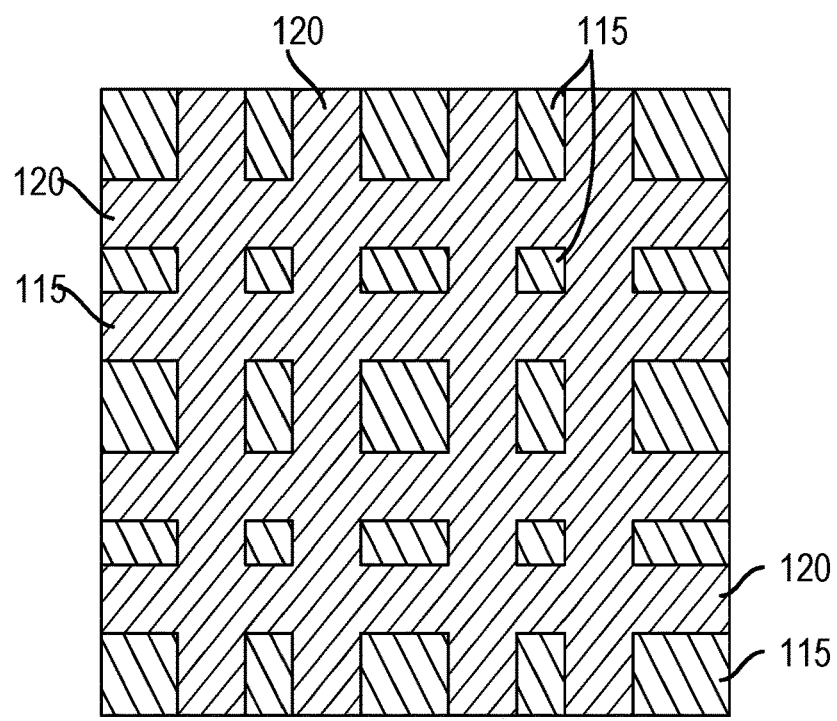
Figure 5A:
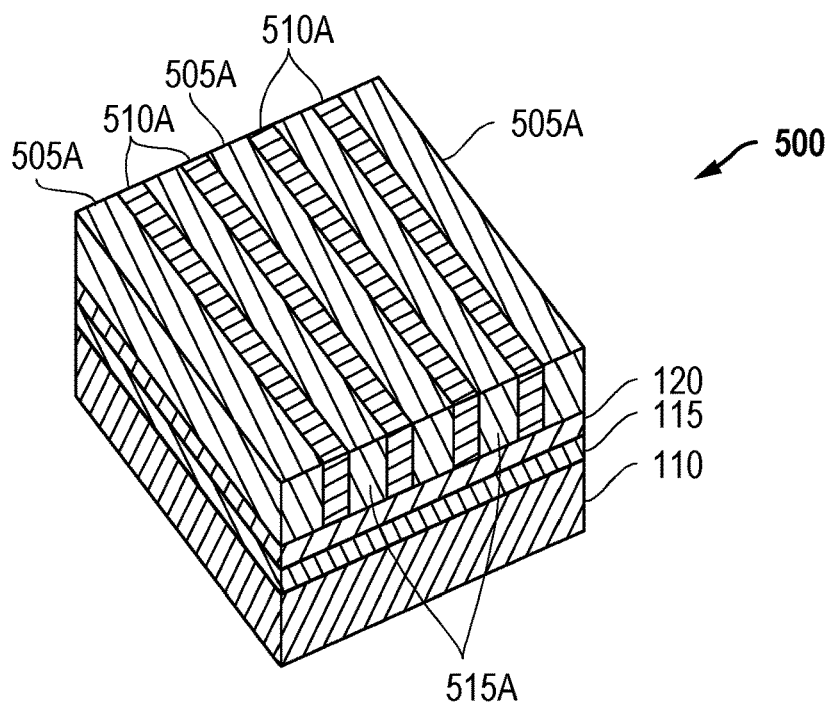
FIGS. 5A-8B illustrate a SAMP process utilizing spacers to define an overlay pattern size.
Figure 5B:
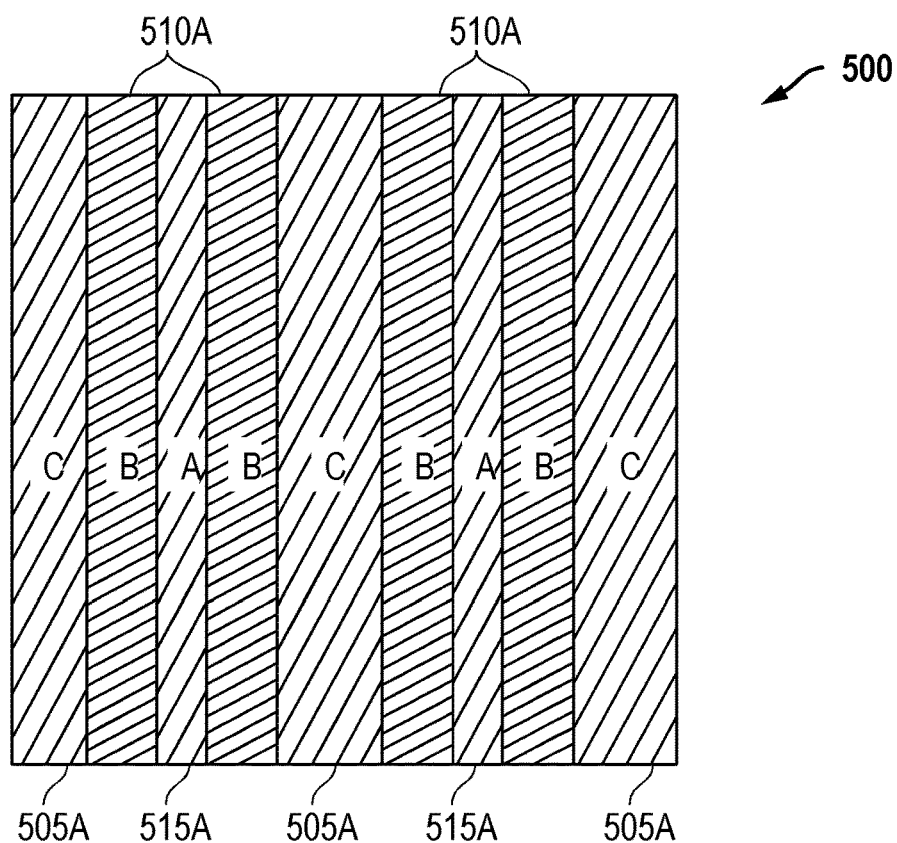
Figure 6A:
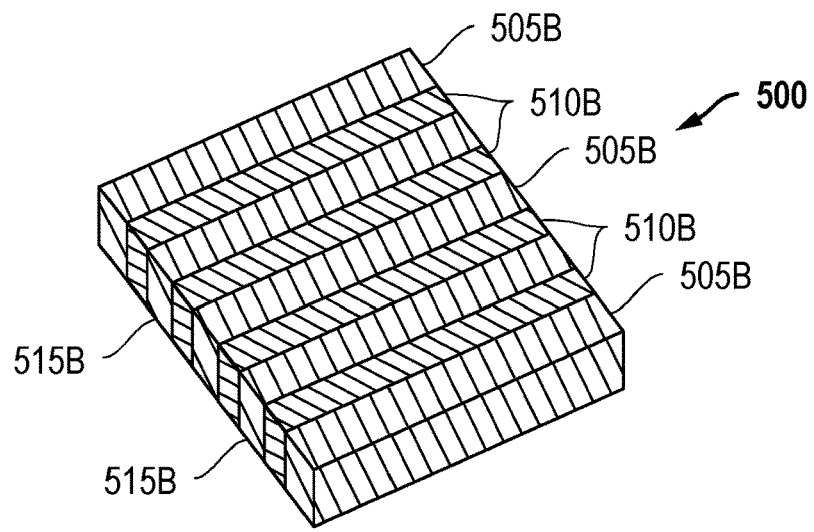
Figure 6B:
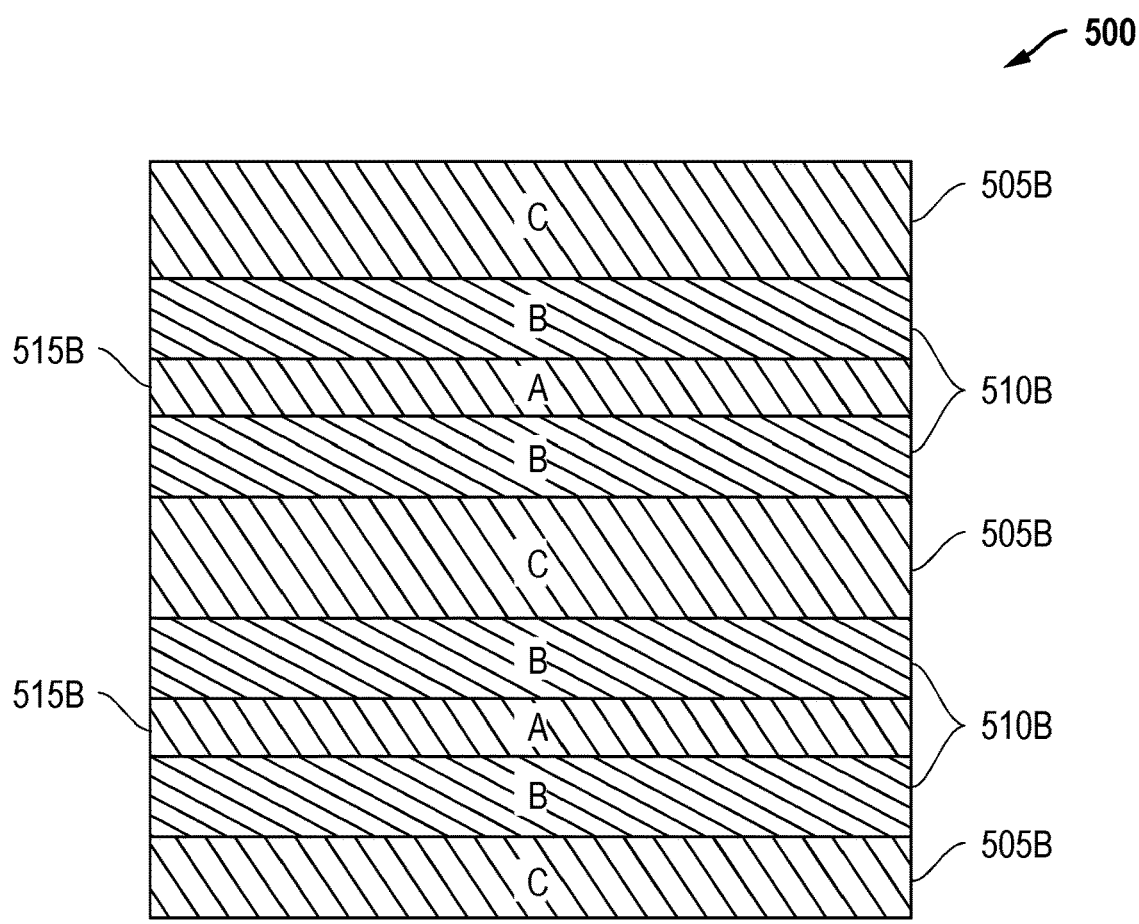

As shown in FIG. 5A, a substrate 500 may have underlying layers 110. A first layer and a second layer may be formed overlying the underlying layers 110, similar to the structure shown in FIG. 1A. More particularly a SiN layer 115 and A-Si layer 120 may be provided. It will be recognized by those skilled in the art that the use of SiN and A-Si are merely exemplary, and a wide range of materials may be utilized depending upon the particular process flow for which the SAMP techniques are being utilized. Then, over the A-Si layer 120 a first (lower) multicolor pattern array is formed, such as an array of patterns of A regions 515A, B regions 510A, and C regions 505A as shown in FIGS. 5A and 5B. As will be described in more detail below, the B regions of the first multicolor pattern array may be formed from a process utilizing a spacer that has been formed by ALD. The SiN layer and A-Si layer thus are underlying the first (lower) multicolor pattern array of the SAMP process.

Figure 7A:
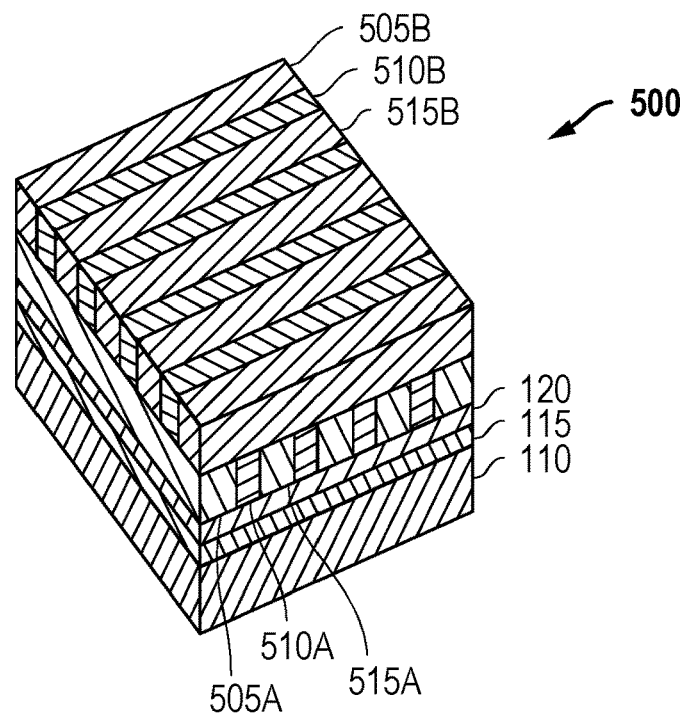
Figure 7B:
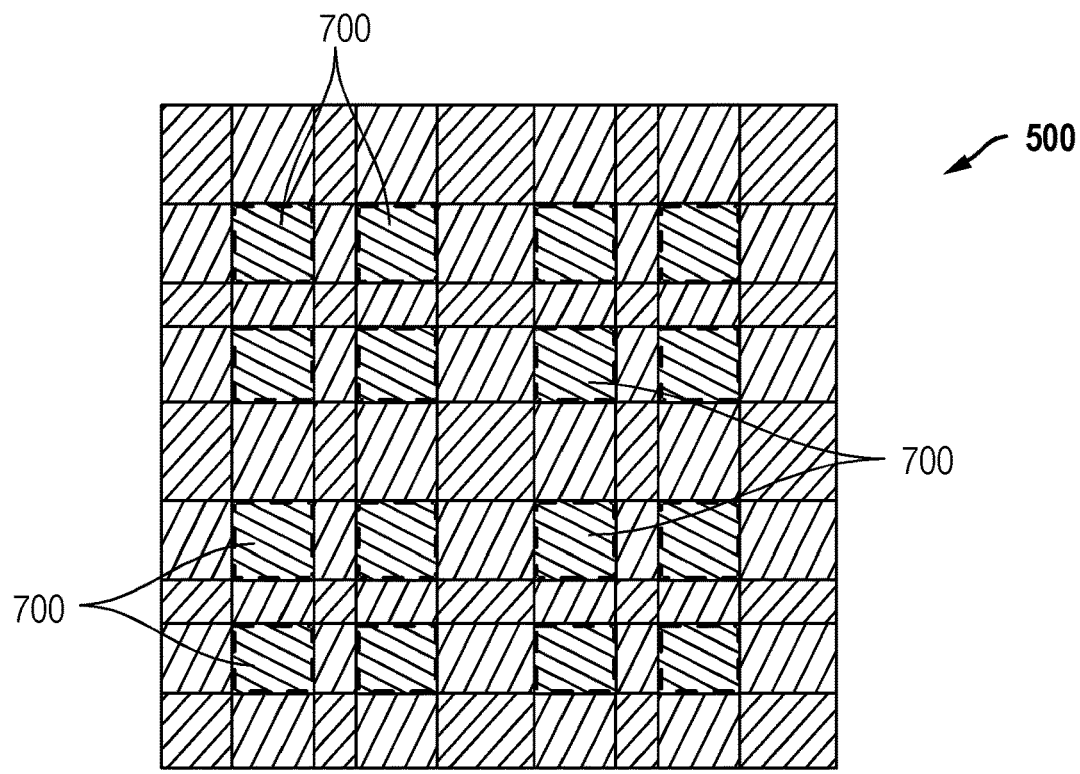

Then a second (upper) multicolor array pattern may be provided. The second multicolor array pattern is shown conceptually in FIGS. 6A and 6B in isolation, indicating the A regions 515B, B regions 510B, and C regions 505B of the second multicolor array pattern. The formation of the second multicolor pattern on the substrate is shown in FIG. 7. As with the first multicolor pattern and as will be described in more detail below, the B regions of the second multicolor pattern array may be formed from a process utilizing an spacer that has been formed by ALD. The areas of overlap of the B regions of the first multicolor pattern and the B regions of the second multicolor pattern are shown in a top view of FIG. 7B and indicated by regions of overlay 700 (bounded by the dashed lines). Because the B material of both the first multicolor array (lower array) and the second multicolor array (upper array) may be provided as a spacer formed on the sidewalls of the C material, the width of the B regions may be highly controllable. For example, the C material of both the lower array and the upper array may be a mandrel and the B material may be spacers formed on the mandrel sidewalls. AS described in more detail below, the A material may be formed of a gap-fill material.

Figure 8A:
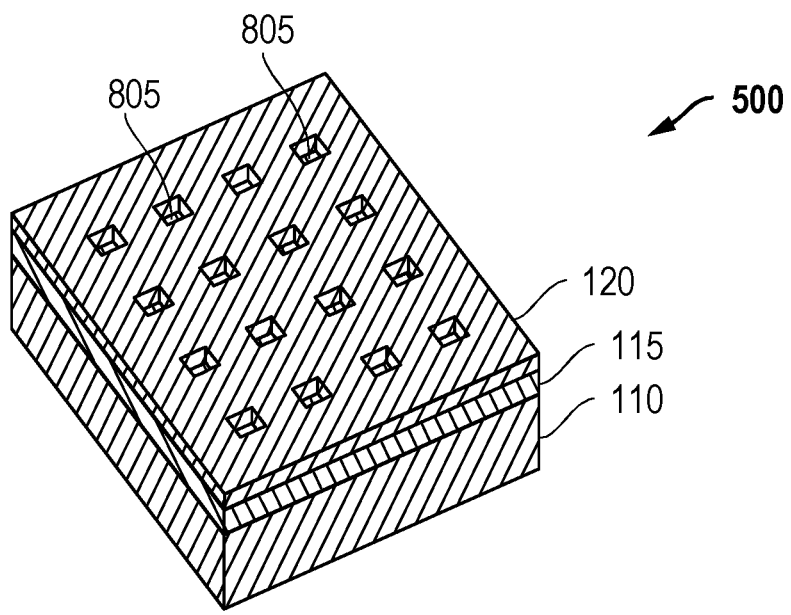
Figure 8B:
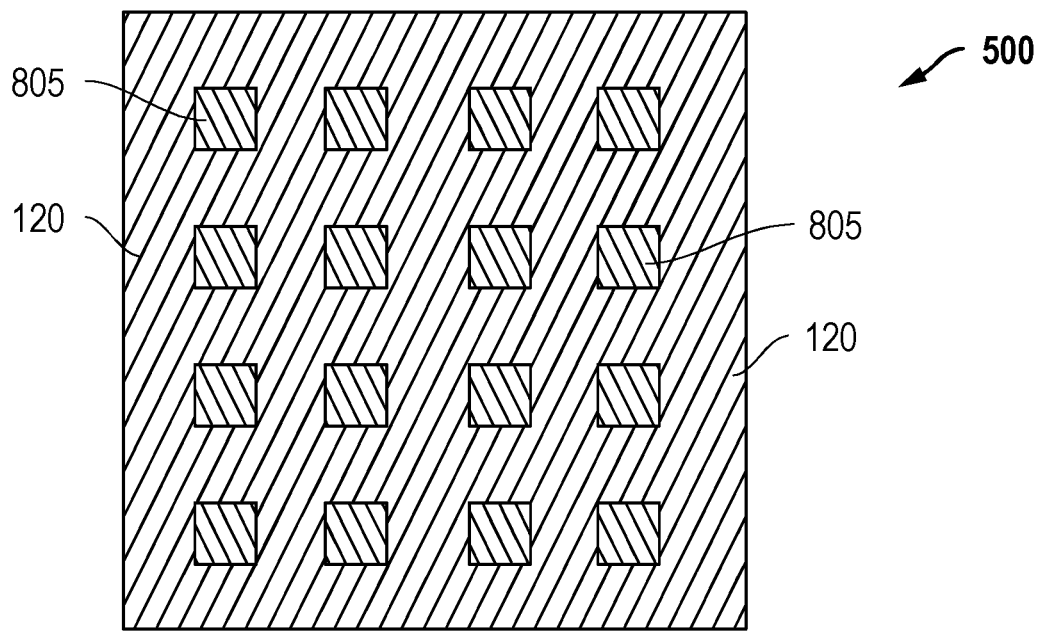

In one embodiment, the spacer layers (and corresponding spacers) are formed via an ALD process. The use of an ALD process provides highly controllable thicknesses for the spacer layers (and corresponding widths of the spacers), particularly for very small geometries. When the pattern from the SAMP process is then transferred to the underlying A-Si and SiN layers, the pattern transfer provides a good LCDU as shown in FIGS. 8A and 8B due to use of the techniques described in more detail below. More particularly, the holes 805 in the A-Si layer 120 correspond to the regions of overlay 700.

Thus, the memory hole patterning technology uses mandrel, spacer, gap-fill, and multi-patterning technology using multicolor array consisting of three materials. The overlay of spacers in the first layer multilayer and spacers in the second layer multilayer combine to form the desired pattern. The combination angle can be overlapped in the range of 0-90 deg. Thus, the first multicolor array and the second multicolor array are oriented differently and a memory hole pattern is formed by selectively cutting the overlapping portion of the first layer and the second layer. Further, the size of the memory holes may be defined by the width of the spacers. The SAMP process may be combined with any of SADP, SAQP, SAOP, etc. process flows and can also be created by combining existing semiconductor materials. For example, a core (or mandrel) material, spacer material and gap-fill material may be formed on a variety of layers and materials. Exemplary core/mandrel materials include amorphous carbon, photoresist, silicon oxide, silicon nitride, and spin on carbon. Exemplary spacer materials include silicon oxide and silicon nitride. Exemplary gap-fill materials include spin on glass and spin on carbon. Exemplary underlayers under the multicolor array pattern include amorphous silicon, silicon nitride, titanium nitride, and titanium oxide. It will be recognized that other materials and combinations of materials may be utilized and the materials described above are merely exemplary.

An exemplary process flow which illustrates the techniques described herein is shown in more detail in FIGS. 9-22.

Figure 9:
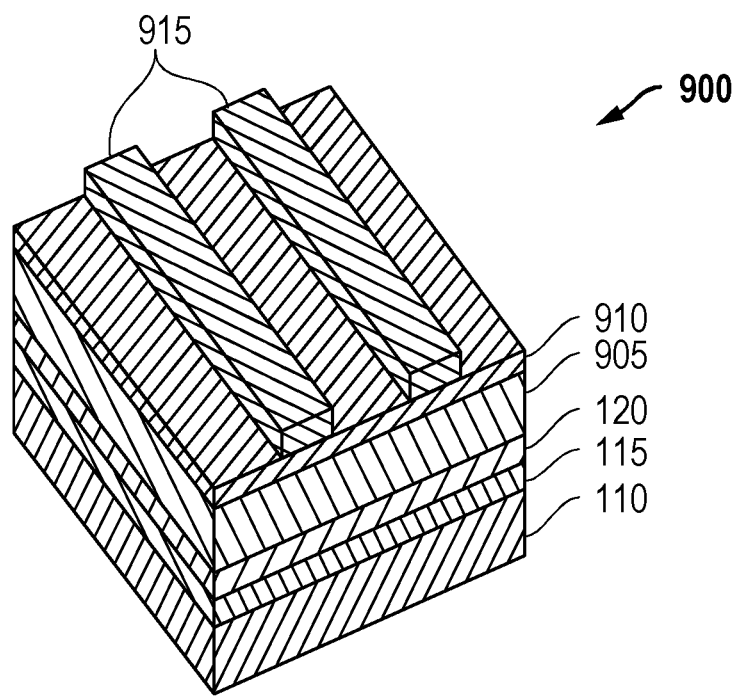
FIGS. 9-22 illustrate one exemplary embodiment of a process flow utilizing the SAMP techniques disclosed herein.

As shown in FIG. 9, a substrate 900 has underlying layers 110, an SiN layer 115 formed above the underlying layers, an A-Si layer 120 formed above the SiN layer 115, an organic planarization layer (OPL) 905 (in this example a spin on carbon layer) formed above the A-Si layer 120, and a silicon antireflective coating (SiARC) layer 910 formed above the OPL layer 905. Above this stack of layers, a first lithography pattern 915 is formed. The first lithography pattern 915 may be formed of any of a variety of materials including, but not limited to, photo resists, hard masks, or the like as is well known in the art. It will be recognized that the underlying layers 110 of the substrate 900 as provided prior to formation of the SiN layer may be comprised of a number of different process layers defining a variety of structures and patterns formed of a variety of materials, all formed prior to initiating the SAMP process described herein. For example, when the techniques disclosed herein are utilized to form a memory hole pattern, the substrate may contain all the process layers, structures and patterns of a particular process flow leading up to the desired memory hole pattern formation step.

Figure 10:
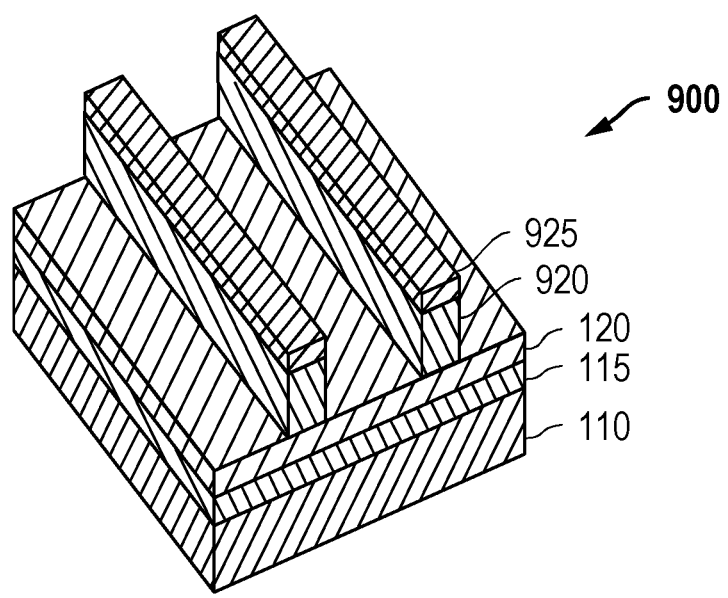

The mandrels (or cores) may be etched according to the first lithography pattern 915. The result of such an etch is shown in FIG. 10 where the remaining portions of the OPL layer 905 and the SiARC layer 910 form the mandrel lower portion 920 and the mandrel upper portion 925 respectively.

Figure 11:
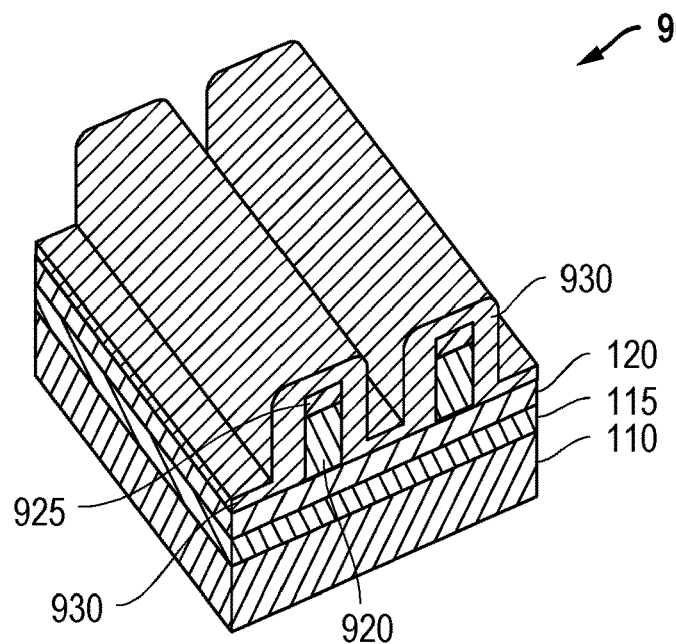

Next as shown in FIG. 11, a spacer deposition may be performed to provide a spacer layer 930. In one embodiment, the spacer deposition may be an ALD process which provides a layer having a highly uniform and controllable thickness and a corresponding highly uniform and controllable spacer width. In one exemplary embodiment, the spacer layer is an oxide layer. In one embodiment, the spacer layer is comprised of silicon oxide.

An etch back of the spacer layer 930 may be performed which removes at least a portion of the spacer layer 930 but leaves the spacers 935 on the sidewalls of the mandrels. Then, a gap fill layer 940 may be formed, for example a spin on carbon layer, thus resulting in the structure of FIG. 12. As discussed in more detail below, the gap fill layer 940 may be formed directly on the spacer layer 930 without the performance of a spacer layer etch back step. However, a better defined pattern may result from use of a spacer etch back after the spacer layer 930 is performed and prior to the formation of the gap fill layer 940.

Figure 13:
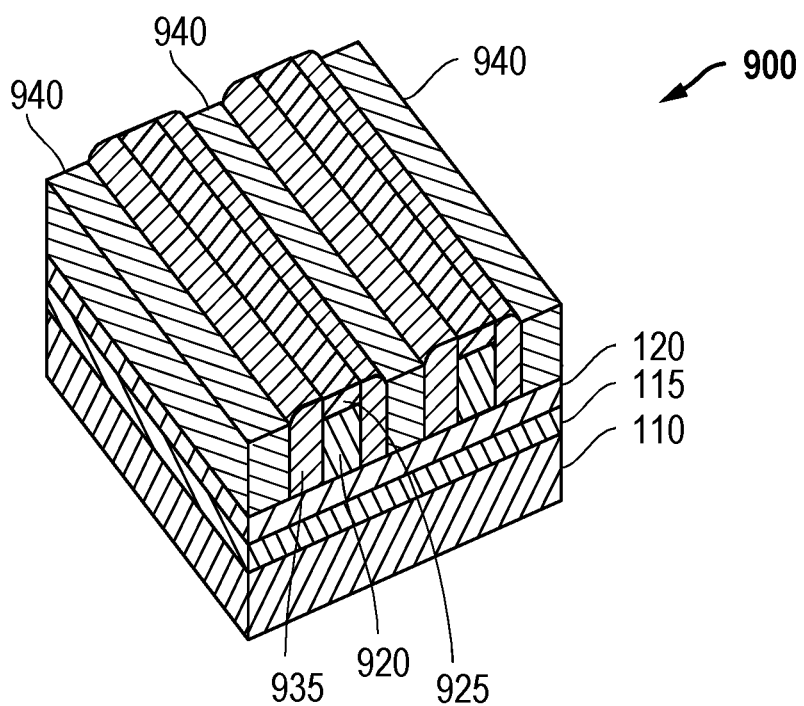

Next as shown in FIG. 13, the gap fill layer 940 may be partially removed. The removal may be an etch back process, chemical mechanical planarization process, or the like. As shown in FIG. 13, the first basic pattern of the SAMP process has been formed with three basic portions of the pattern array: the mandrel region (region C of FIGS. 5-8) formed by the mandrel lower portion 920 and the mandrel upper portion 925, spacer region formed by the spacers 935 (region B of FIGS. 5-8) and gap fill region formed by the remaining portions of the gap fill layer 940 (region A of FIGS. 5-8). Thus a first multicolor array is formed similar to that shown in FIG. 5 above.

Figure 14:
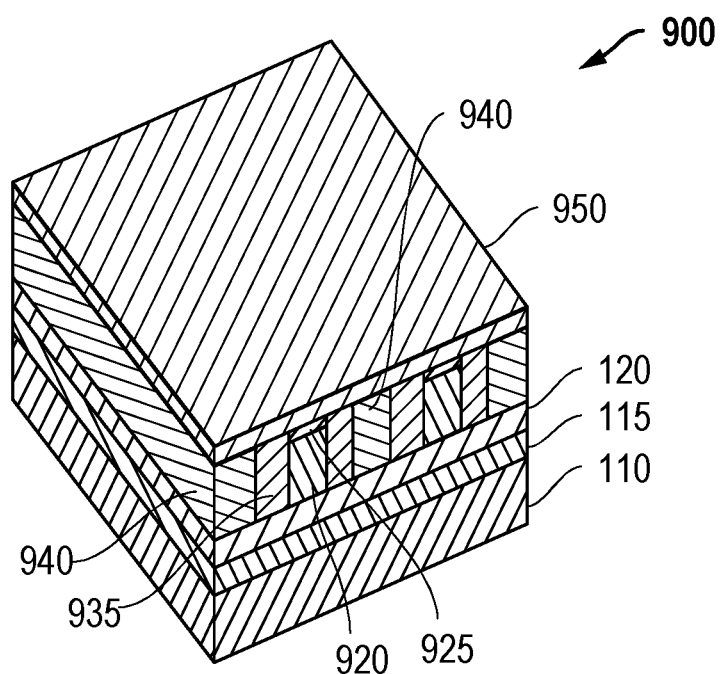
Figure 15:
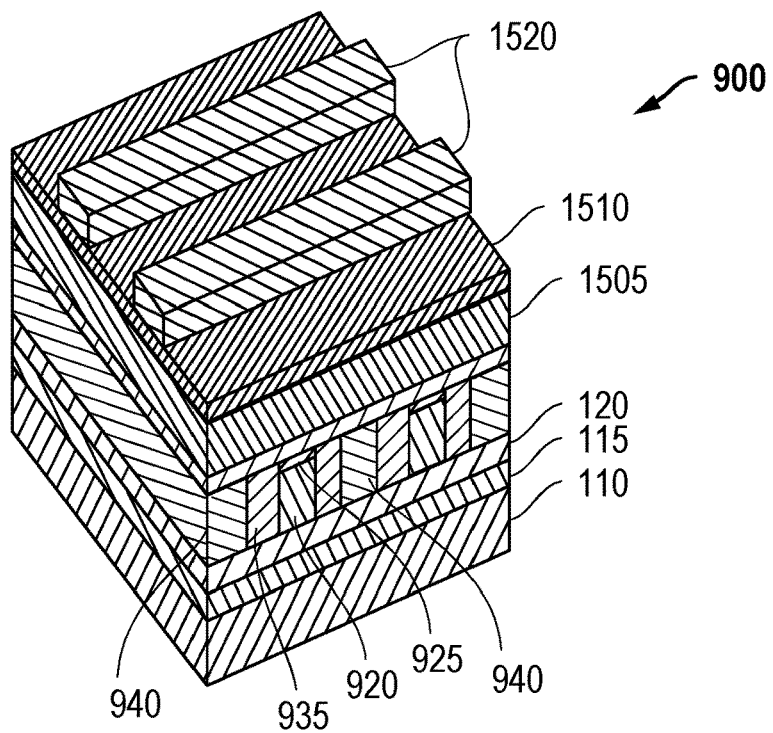

Then formation of the second multicolor array over the first multicolor array may commence. As shown in FIG. 14, a passivation layer 950 may be formed. For example in one embodiment, the passivation layer 950 an oxide layer. Next, as shown in FIG. 15, a second OPL layer 1505 (for example spin on carbon) and second SiARC layer 1510 may be formed above the substrate. A second lithography pattern 1520 may also be formed as shown in FIG. 15. The second lithography pattern 1520 may be comprised of a patterned photoresist, patterned hard mask, etc. as is well known in the art.

Figure 16:
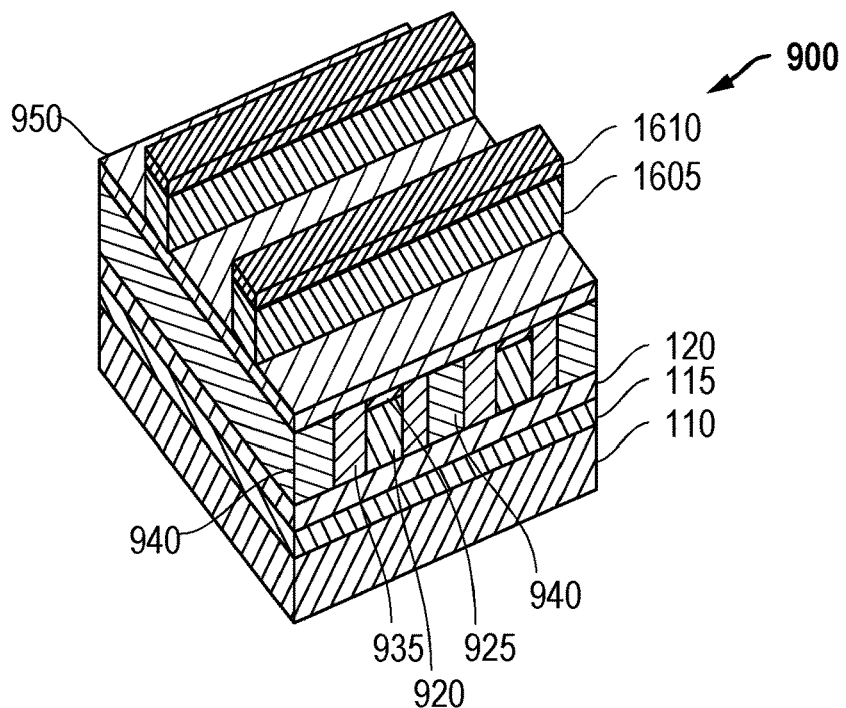
Figure 17:
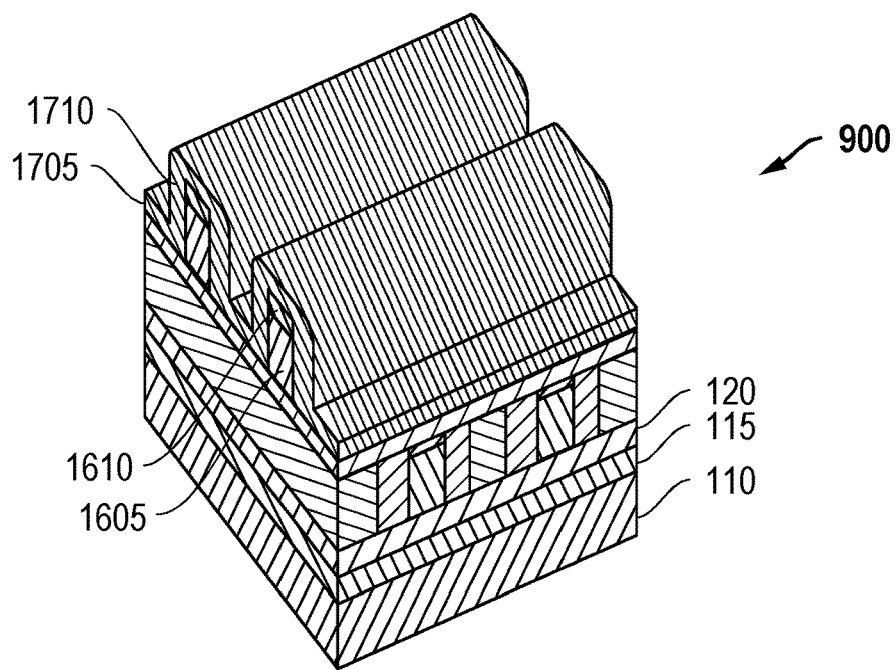

Then, the second (upper) mandrels may be formed by etching the second SiARC layer 1510 and the second OPL layer 1505 to leave the second mandrel lower portion 1605 the second mandrel upper portion 1610 as shown in FIG. 16. Then, a second spacer deposition may be performed to form the second spacer layer 1705 as shown in FIG. 17. As with the first spacer deposition, in one exemplary embodiment, the second spacer layer is an ALD oxide layer. The second spacer layer 1705 may form second spacers 1710 on the sidewalls of the second mandrels as shown in FIG. 17.

Figure 12:
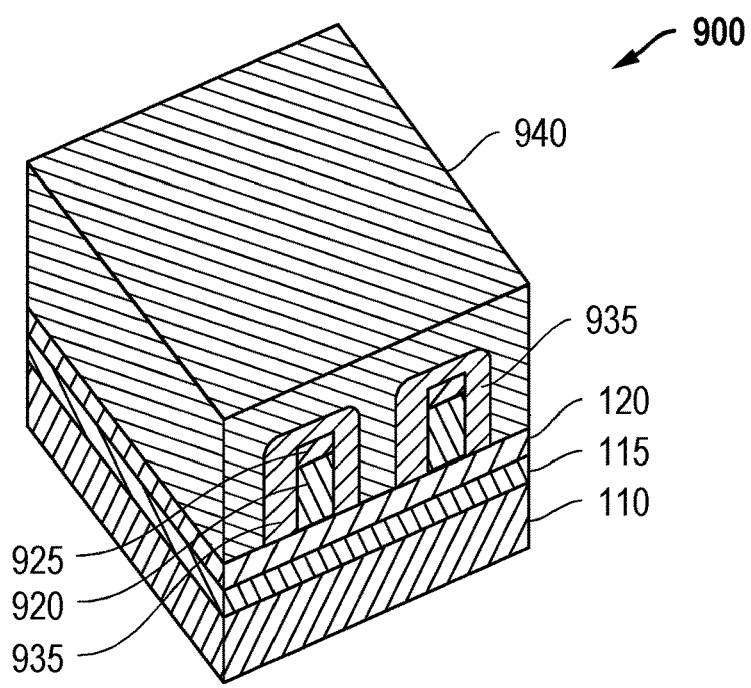
Figure 18:
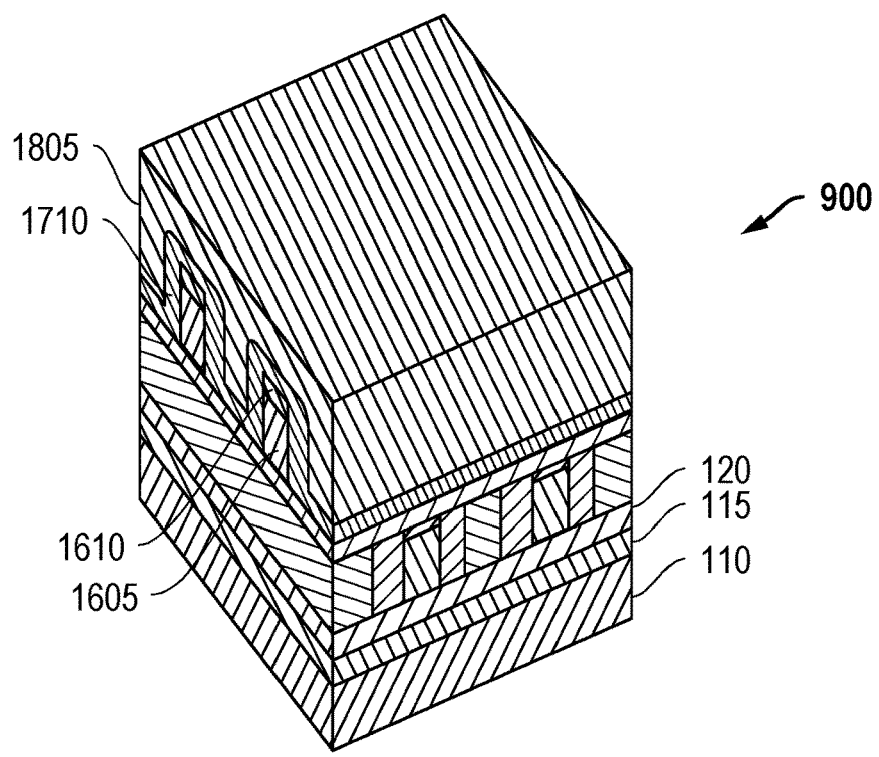

After the second spacer deposition forms the second spacer layer 1705, a second gap fill layer 1805 (for example a spin on carbon) may be formed as shown in FIG. 18. In the embodiment shown, the second gap fill layer 1805 may be formed directly after the formation of the second spacer layer 1705. Alternatively, similar to the processing of the lower pattern array as shown in FIG. 12, a second spacer etch may be performed to leave the second spacers 1710 on the sidewalls of the second mandrel structure while removing at least a portion of the other parts of the second spacer layer 1705. It has been found, in at least one embodiment, that the ultimate hole pattern created may have an improved shape if a spacer etch is performed at the lower multicolor array pattern. However, at either the upper or lower multicolor array patterns, the advantages of the use of a spacer to define the memory hole pattern (and in particular an ALD spacer) may be achieved with or without the use of a spacer etch.

Figure 19:
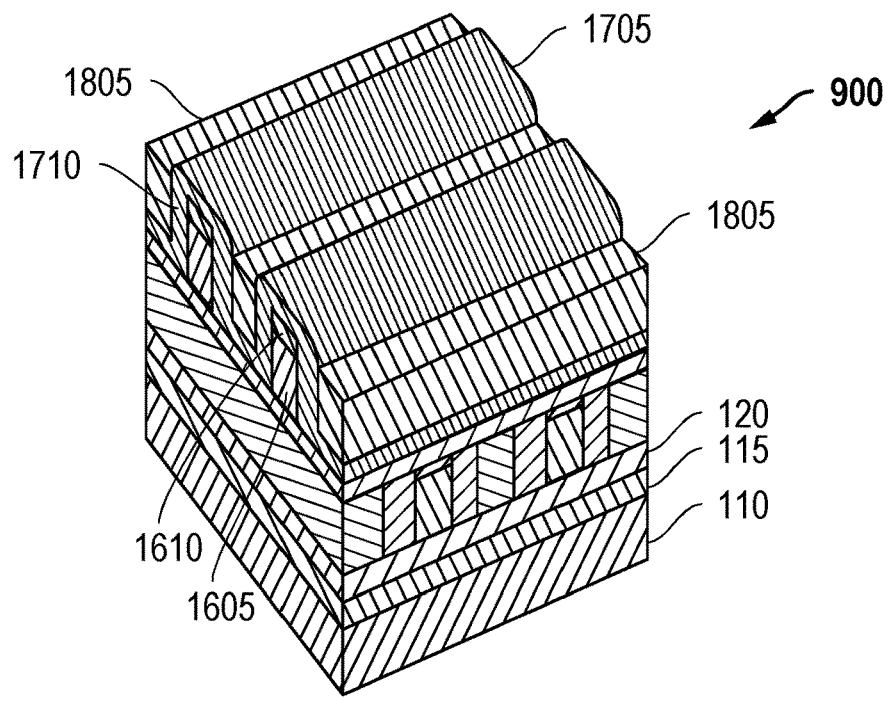

The second gap fill layer 1805 may then be etched or planarized back to provide the structure shown in FIG. 19. It will be recognized that the structure of FIG. 19 provides the second basic pattern (the upper multicolor pattern) of the SAMP process formed with three basic portions of the pattern array: the mandrel region (region C) formed by the second mandrel lower portion 1605 and second mandrel upper portion 1610, spacer region (region B) formed by the second spacers 1710 and gap fill region (region A) formed by the remaining portions of the second gap fill layer 1805. Thus a second multicolor array is formed above the first multicolor pattern similar to that shown in FIG. 7A.

Figure 20:
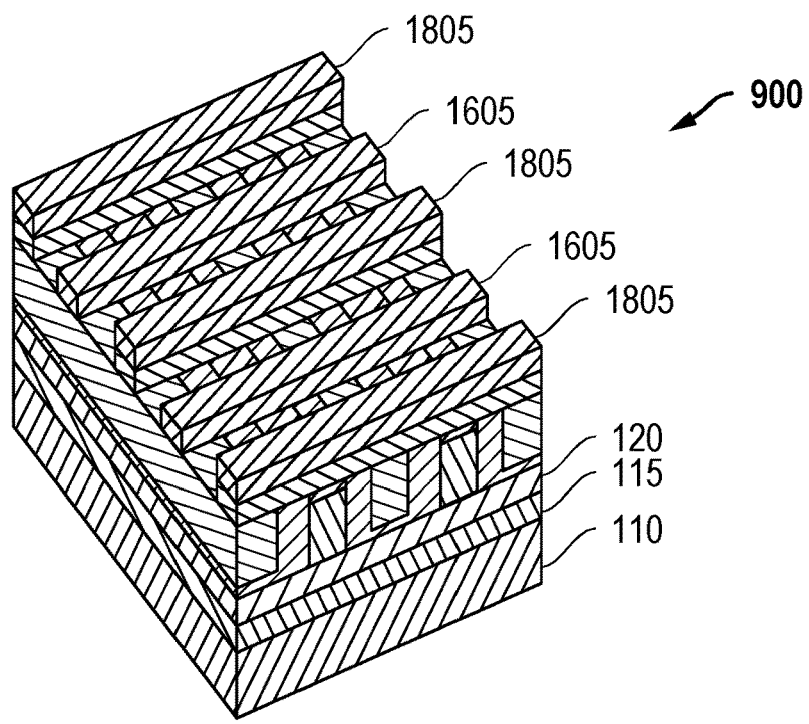

Then, a first selective pull step may be performed to provide the structure shown in FIG. 20. The first selective pull step may be a selective oxide etch which selectively pulls the oxides that are exposed in the spaces between the second gap fill material and the second mandrels while leaving the second gap material and the second mandrels on the substrate as shown in FIG. 20. More specifically, the exposed second spacers 1710 (and underlying portions of the passivation layer 950) may be etched while leaving the portions of the second gap fill layer 1805 and at least the second mandrel lower portion 1605. In the example shown, the second mandrel upper portion 1610 (SiARC) is also removed at this etch step. However, depending upon the materials utilized for the various layers and the particular etches used, such removal of the second mandrel upper portion 1610 may not happen.

At this point in the process, the first multicolor pattern array may then be exposed in the spaces between the second gap fill layer 1805 and the second mandrel lower portion 1605 as shown in FIG. 20. However, the second gap fill layer 1805 and the second mandrel lower portion 1605 block exposure of the first multicolor pattern array where the second gap fill layer 1805 and the second mandrel lower portion 1605 exists. It will be noted that the spaces between the second gap fill layer 1805 and the second mandrel lower portion 1605 are generally defined by the thickness of the ALD spacers, a relatively controlled and uniform thickness. Next, a second selective pull step may be performed. The second selective pull step may etch the underlying (now exposed) spacers 935 of the lower multicolor array. Again depending upon the materials and etch utilized, portions of the mandrel upper portion 925 (formed of SiARC in one example) may also be etched. The mandrel structures and the gap fill layers will again block etching in those areas. Further, the A-Si layer 120 may be etched by the etch used to etch the spacers 935 or an additional etch step after the etch of the spacers 935 may be performed to etch the exposed areas of A-Si. Thus, the portions of the A-Si layer 120 that are now exposed (the regions under the now etched areas of the overlay regions of the spacers 935 and second spacers 1710) may also be etched. It is noted that the pattern etched in the A-Si layer 120 will correspond to the desired memory hole pattern, a pattern defined by the overlay of the spacers 935 and second spacers 1710. The structure after the second selective pull step is shown in FIG. 21.

Figure 21:
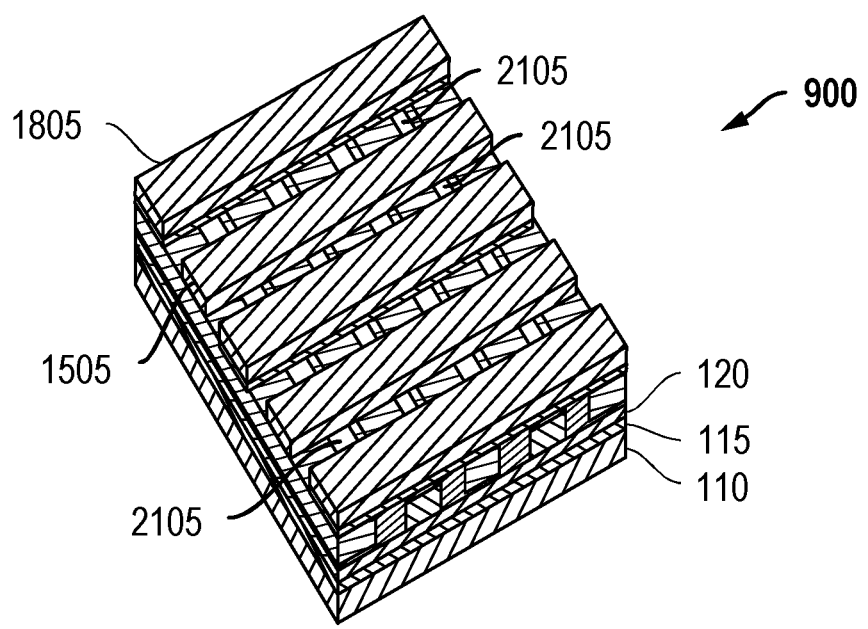

As shown in FIG. 21, portions of the SiN layer 115 formed on the substrate are now exposed as portions of the A-Si layer 120 have been etched. As mentioned above, the removed portions of the A-Si layer 120 correspond to the desired memory hole pattern, a pattern whose dimensions are set by the dimensions of the upper spacers and the lower spacers. More particularly, the etched portions of the A-Si layer will be defined by the spacer widths of the lower spacers and the upper spacers. Such widths are relatively controllably. Moreover, the use of ALD processes to form the spacers allows the widths to be controlled to even very small geometries.

The various layers above the A-Si layer 120 may then be stripped. After the stripping of these layers a pattern of the A-Si layer 120 will result as shown in FIG. 22.

Figure 22:
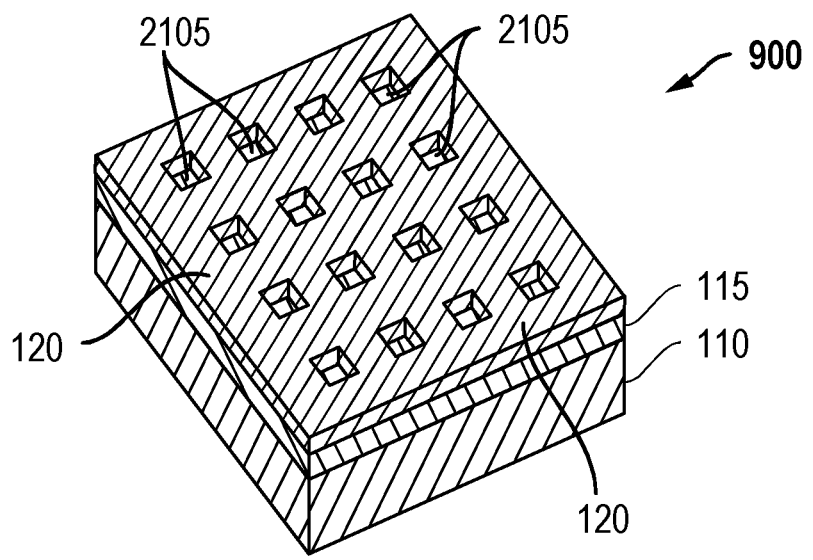

Again, because the etch in the A-Si layer 120 (and the corresponding exposure of the SiN layer 115 under the A-Si layer 120) will be defined by the spacer widths of the first spacer layer and the second spacer layer, the pattern as seen in FIG. 22 will have very good LCDU control, even for very small geometries. For example, in one embodiment, geometries (for both the first and second multicolor arrays) may be (1) for the thickness of the spacer layers and the corresponding widths of the spacers, in the range of 5 to 40 nm, (2) for the mandrel width, in the range of 15 to 60 nm, and (3) for the widths of the region that the gap fill layer fills, in the range of 10 to 100 nm. In one embodiment of the process described herein, a memory hole CD of 13.4 nm may be obtained having a three sigma LCDU of 0.89 nm. The obtained LCDU variation will be primarily defined by the ALD process variation. Because typical ALD processes as known in the art may yield a thickness variation which may be controlled to 1 nm or less, the LCDU variation may similarly be 1 nm or less. The pattern of FIG. 22 may then be utilized as the pattern to form the desired memory holes, such as for example, memory holes for use in a DRAM structure. In one embodiment, the techniques disclosed herein may be utilized to provide LCDU control for a sub 10 nm process node for formation of semiconductor structures.

Figure 23:
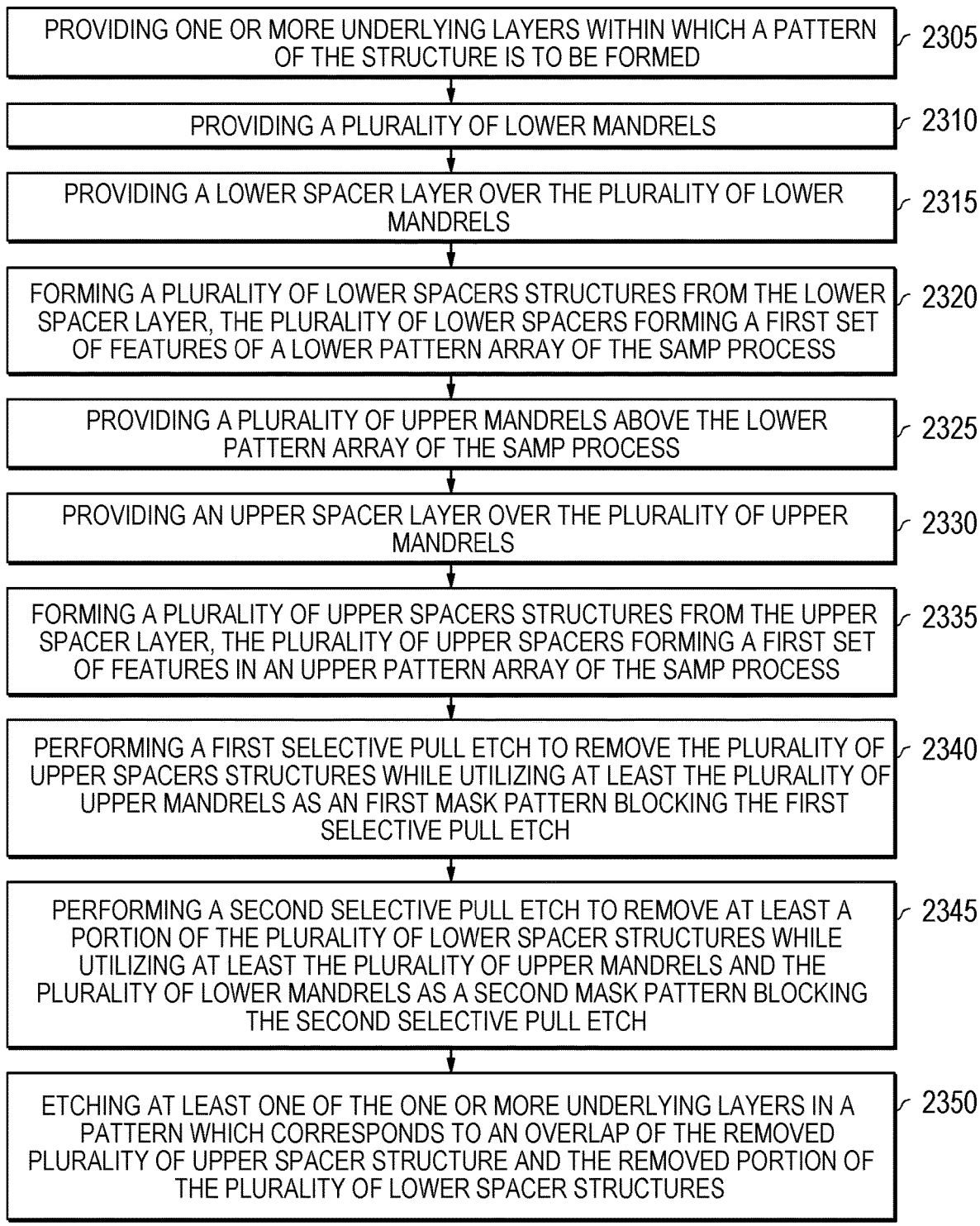
FIGS. 23 and 24 illustrate exemplary methods for using the techniques described herein.
Figure 24:
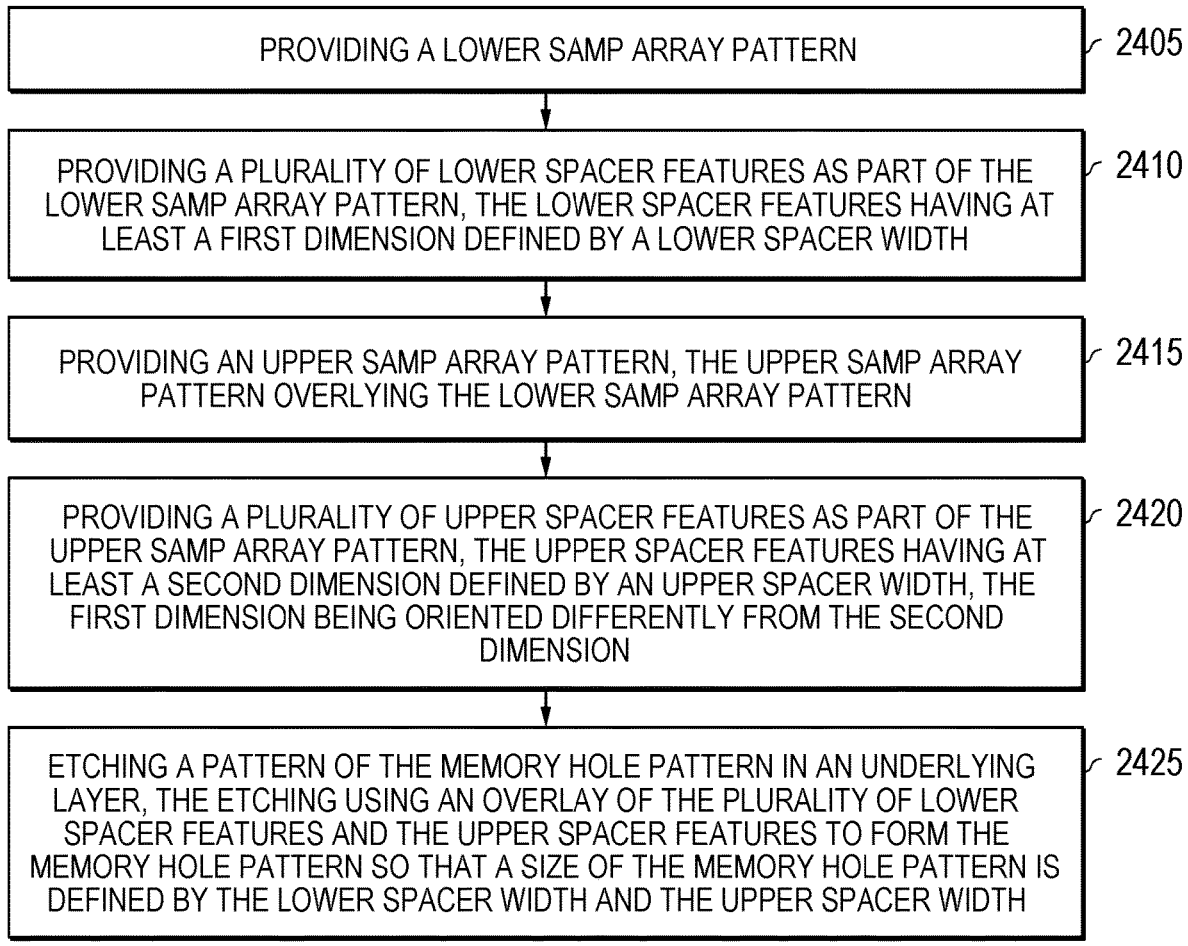

FIGS. 23-24 illustrate exemplary methods for use of the processing techniques described herein. It will be recognized that the embodiments of FIGS. 23-24 are merely exemplary and additional methods may utilize the techniques described herein. Further, additional processing steps may be added to the methods shown in the FIGS. 23-24 as the steps described are not intended to be exclusive. Moreover, the order of the steps is not limited to the order shown in the figures as different orders may occur and/or various steps may be performed in combination or at the same time.

FIG. 23 illustrates a method of forming a structure on a substrate using a self-aligned multiple patterning (SAMP) process. The method includes a step 2305 of providing one or more underlying layers within which a pattern of the structure is to be formed. The method also includes step 2310 of providing a plurality of lower mandrels and step 2315 of providing a lower spacer layer over the plurality of lower mandrels. The method further comprises step 2320 of forming a plurality of lower spacer structures from the lower spacer layer, the plurality of lower spacer structures forming a first set of features of a lower pattern array of the SAMP process. The method also includes step 2325 of providing a plurality of upper mandrels above the lower pattern array of the SAMP process and step 2330 of providing an upper spacer layer over the plurality of upper mandrels. The method also comprises step 2335 of forming a plurality of upper spacer structures from the upper spacer layer, the plurality of upper spacer structures forming a first set of features in an upper pattern array of the SAMP process. The method further comprises step 2340 of performing a first selective pull etch to remove the plurality of upper spacers structures while utilizing at least the plurality of upper mandrels as an first mask pattern blocking the first selective pull etch. The method also comprises step 2345 of performing a second selective pull etch to remove at least a portion of the plurality of lower spacer structures while utilizing at least the plurality of upper mandrels and the plurality of lower mandrels as a second mask pattern blocking the second selective pull etch. The method finally comprises step 2350 of etching at least one of the one or more underlying layers in a pattern which corresponds to an overlap of the removed plurality of upper spacer structure and the removed portion of the plurality of lower spacer structures.

FIG. 24 illustrates a method of forming a memory hole pattern on a substrate using a self-aligned multiple patterning (SAMP) process. The method comprises step 2405 of providing a lower SAMP array pattern and step 2410 of providing a plurality of lower spacer features as part of the lower SAMP array pattern, the lower spacer features having at least a first dimension defined by a lower spacer width. The method further comprises step 2415 of providing an upper SAMP array pattern, the upper SAMP array pattern overlying the lower SAMP array pattern. The method also comprises step 2420 of providing a plurality of upper spacer features as part of the upper SAMP array pattern, the upper spacer features having at least a second dimension defined by an upper spacer width, the first dimension being oriented differently from the second dimension. The method further comprises step 2425 of etching a pattern of the memory hole pattern in an underlying layer, the etching using an overlay of the plurality of lower spacer features and the upper spacer features to form the memory hole pattern so that a size of the memory hole pattern is defined by the lower spacer width and the upper spacer width.

The substrates utilized with the techniques disclosed herein may be any substrates for which the etching and patterning of material is desirable. For example, in one embodiment, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of forming a structure on a substrate using a self-aligned multiple patterning (SAMP) process, comprising:
   providing one or more underlying layers within which a pattern of the structure is to be formed;
   forming a plurality of lower mandrels on the one or more underlying layers, the plurality of lower mandrels each comprising a double-layer stack formed from a first antireflective coating disposed on a first organic planarization layer;
   providing a lower spacer layer over the plurality of lower mandrels;
   providing a lower gap-fill layer over the lower spacer layer filling recessed regions of the lower spacer layer between adjacent ones of the plurality of lower mandrels;
   forming a plurality of lower spacer structures by planarizing the plurality of lower mandrels, the lower spacer layer, and the lower gap-fill layer to expose planarized surfaces of the first antireflective coating, the lower spacer layer, and the lower gap-fill layer, the plurality of lower spacer structures forming a first set of features of a lower pattern array of the SAMP process;
   forming a plurality of upper mandrels above the lower pattern array of the SAMP process including the first organic planarization layer, the plurality of upper mandrels each comprising a double-layer stack formed from a second antireflective coating disposed on a second organic planarization layer;
   providing an upper spacer layer over the plurality of upper mandrels;
   providing an upper gap-fill layer over the upper spacer layer filling recessed regions of the upper spacer layer between adjacent ones of the plurality of upper mandrels;
   forming a plurality of upper spacer structures by planarizing the plurality of upper mandrels, the upper spacer layer, and the upper gap-fill layer to expose planarized surfaces of the second antireflective coating, the upper spacer layer, and the upper gap-fill layer, the plurality of upper spacer structures forming a second set of features in an upper pattern array of the SAMP process;
   performing a first selective pull etch to remove the plurality of upper spacer structures while utilizing at least the plurality of upper mandrels as a first mask pattern blocking the first selective pull etch;
   performing a second selective pull etch to remove at least a portion of the plurality of lower spacer structures while utilizing at least the plurality of upper mandrels and the plurality of lower mandrels as a second mask pattern blocking the second selective pull etch; and
   etching at least one of the one or more underlying layers to form the pattern corresponding to an overlap of the removed plurality of upper spacer structures and the removed portion of the plurality of lower spacer structures.

2. The method of claim 1, wherein the structure is a memory hole pattern, and wherein critical dimensions of the memory hole pattern are set by a width of the upper spacer structures and a width of the lower spacer structures.

3. The method of claim 2, wherein the lower spacer layer is a lower atomic layer deposition layer and the upper spacer layer is an upper atomic layer deposition layer.

4. The method of claim 3, wherein the lower spacer layer is a lower oxide layer and the upper spacer layer is an upper oxide layer.

5. The method of claim 1, wherein the lower spacer layer is a lower atomic layer deposition layer and the upper spacer layer is an upper atomic layer deposition layer.

6. The method of claim 5, wherein the lower spacer layer is a lower oxide layer and the upper spacer layer is an upper oxide layer.

7. The method of claim 5, wherein the lower gap-fill layer and the upper gap-fill layer each comprise spin on carbon.

8. The method of claim 7, wherein the structure is a memory hole pattern, critical dimensions of the memory hole pattern defined by a width of the upper spacer structures and a width of the lower spacer structures.

9. The method of claim 8, wherein the lower spacer layer is a lower atomic layer deposition layer and the upper spacer layer is an upper atomic layer deposition layer.

10. The method of claim 1, further comprising:
after forming the plurality of lower spacer structures, performing an etch of the plurality of lower spacer structures to expose upper surfaces of the plurality of lower mandrels.

11. A method of forming a memory hole pattern on a substrate using a self-aligned multiple patterning (SAMP) process, comprising:
providing a lower SAMP array pattern;
providing a plurality of lower spacer features as part of the lower SAMP array pattern by planarizing a plurality of lower mandrels, a lower spacer layer, and a lower gap-fill layer, wherein the plurality of lower mandrels each comprise a double-layer stack formed from a first antireflective coating disposed on a first organic planarization layer, wherein the planarization exposes planarized surfaces of the first antireflective coating, the lower spacer layer, and the lower gap-fill layer, and wherein the lower spacer features have at least a first dimension defined by a lower spacer width;
providing an upper SAMP array pattern overlying the lower SAMP array pattern;
providing a plurality of upper spacer features as part of the upper SAMP array pattern by planarizing a plurality of upper mandrels, an upper spacer layer, and an upper gap-fill layer, wherein the plurality of upper mandrels each comprise a double-layer stack formed from a second antireflective coating disposed on a second organic planarization layer, wherein the planarization exposes planarized surfaces of the second antireflective coating, the upper spacer layer, and the upper gap-fill layer, and wherein the upper spacer features have at least a second dimension defined by an upper spacer width, the first dimension being oriented differently from the second dimension; and
etching the memory hole pattern in an amorphous silicon layer to expose a silicon nitride layer, the etching using an overlay of the plurality of lower spacer features and the upper spacer features to form the memory hole pattern so that a size of the memory hole pattern is defined by the lower spacer width and the upper spacer width.

12. The method of claim 11, wherein the lower spacer features are formed from a lower atomic layer deposition layer and the upper spacer features are an upper atomic layer deposition layer.

13. The method of claim 12, wherein the lower atomic layer deposition layer comprises oxide and the upper atomic layer deposition layer comprises oxide.

14. The method of claim 11, wherein a local critical dimension uniformity of the size of the memory hole pattern etched in the amorphous silicon layer is less than 1 nm.

15. A method of forming a structure on a substrate using a self-aligned multiple patterning (SAMP) process, comprising:
providing a silicon nitride layer on an underlying layer;
providing an amorphous silicon layer on the silicon nitride layer;
forming a plurality of lower mandrels on the amorphous silicon layer, the plurality of lower mandrels each comprising a double-layer stack formed from a first antireflective coating disposed on a first organic planarization layer;
providing a lower spacer layer over the plurality of lower mandrels;
providing a lower gap-fill layer over the lower spacer layer filling recessed regions of the lower spacer layer between adjacent ones of the plurality of lower mandrels;
forming a plurality of lower spacer structures by planarizing the plurality of lower mandrels, the lower spacer layer, and the lower gap-fill layer to expose planarized surfaces of the first antireflective coating, the lower spacer layer, and the lower gap-fill layer, the plurality of lower spacer structures forming a first set of features of a lower pattern array of the SAMP process;
forming a plurality of upper mandrels above the lower pattern array of the SAMP process, the plurality of upper mandrels each comprising a double-layer stack formed from a second antireflective coating disposed on a second organic planarization layer;
providing an upper spacer layer over the plurality of upper mandrels;
providing an upper gap-fill layer over the upper spacer layer filling recessed regions of the upper spacer layer between adjacent ones of the plurality of upper mandrels;
forming a plurality of upper spacer structures by planarizing the plurality of upper mandrels, the upper spacer layer, and the upper gap-fill layer to expose planarized surfaces of the second antireflective coating, the upper spacer layer, and the upper gap-fill layer, the plurality of upper spacer structures forming a second set of features in an upper pattern array of the SAMP process;
performing a first selective pull etch to remove the plurality of upper spacer structures while utilizing at least the plurality of upper mandrels as a first mask pattern blocking the first selective pull etch;
performing a second selective pull etch to remove at least a portion of the plurality of lower spacer structures while utilizing at least the plurality of upper mandrels and the plurality of lower mandrels as a second mask pattern blocking the second selective pull etch; and
etching the amorphous silicon layer to expose the silicon nitride layer and form the pattern corresponding to an overlap of the removed plurality of upper spacer structures and the removed portion of the plurality of lower spacer structures.

16. The method of claim 15, further comprising:
after forming the plurality of lower spacer structures, providing a passivation layer on the planarized surfaces of the first antireflective coating, the lower spacer layer, and the lower gap-fill layer, the plurality of upper mandrels being formed on the passivation layer.

17. The method of claim 15, wherein:
the first and second organic planarization layers and the upper and lower gap-fill layers each comprise spin on carbon; and
the first and second antireflective layers comprise silicon.

18. The method of claim 15, wherein the lower spacer layer is a lower atomic layer deposition layer and the upper spacer layer is an upper atomic layer deposition layer.

19. The method of claim 18, wherein the lower atomic layer deposition layer comprises a nitride.

20. The method of claim 18, wherein the lower atomic layer deposition layer comprises a nitride.

* * * * *